United States Patent
Yang

(10) Patent No.: US 11,749,372 B2
(45) Date of Patent: Sep. 5, 2023

(54) MEMORY DEVICE HAVING REFERENCE MEMORY ARRAY STRUCTURE RESEMBLING DATA MEMORY ARRAY STRUCTURE, AND METHODS OF OPERATING THE SAME

(71) Applicant: eMemory Technology Inc., Hsin-Chu (TW)

(72) Inventor: Cheng-Te Yang, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 46 days.

(21) Appl. No.: 17/547,240

(22) Filed: Dec. 10, 2021

(65) Prior Publication Data

US 2022/0199181 A1 Jun. 23, 2022

Related U.S. Application Data

(60) Provisional application No. 63/150,585, filed on Feb. 18, 2021, provisional application No. 63/127,165, filed on Dec. 18, 2020.

(51) Int. Cl.
G11C 29/38 (2006.01)
G11C 11/16 (2006.01)

(52) U.S. Cl.
CPC .......... *G11C 29/38* (2013.01); *G11C 11/1655* (2013.01); *G11C 11/1657* (2013.01)

(58) Field of Classification Search
None
See application file for complete search history.

(56) References Cited

U.S. PATENT DOCUMENTS

| 6,055,178 A | 4/2000 | Naji | |
| 6,075,722 A * | 6/2000 | Hibino | G11C 11/5692 365/230.01 |
| 6,111,781 A * | 8/2000 | Naji | G11C 11/15 365/158 |
| 6,246,621 B1 * | 6/2001 | Miyamoto | G11C 17/126 365/230.06 |
| 7,630,263 B2 | 12/2009 | Pio | |
| 8,773,887 B1 * | 7/2014 | Naji | G11C 11/1693 365/158 |

(Continued)

FOREIGN PATENT DOCUMENTS

EP 1 047 079 A2 10/2000

*Primary Examiner* — J. H. Hur
(74) *Attorney, Agent, or Firm* — Winston Hsu

(57) ABSTRACT

A memory device includes a data memory array, a reference memory array and a detection circuit. The reference memory array includes (N/2+1) bit lines, (N/2) source lines and reference cells, N being a positive even integer. Each row of reference cells includes a (2n−1)th reference cell and a (2n)th reference cell. The (2n−1)th reference cell includes a first terminal coupled to an nth bit line, and a second terminal coupled to an nth source line, n being a positive integer less than N/2+1. The (2n)th reference cell includes a first terminal coupled to an (n+1)th bit line, and a second terminal coupled to the nth source line. The detection circuit compares a data current outputted from the data memory array and a reference current outputted from the reference memory array to determine a data state of a memory cell.

18 Claims, 10 Drawing Sheets

(56) References Cited

U.S. PATENT DOCUMENTS

| | | | | |
|---|---|---|---|---|
| 2003/0103395 A1* | 6/2003 | Ooishi | ............... | G11C 7/062 |
| | | | | 365/201 |
| 2005/0254294 A1* | 11/2005 | Iwata | ............... | G11C 29/021 |
| | | | | 365/171 |
| 2006/0209585 A1* | 9/2006 | Tanizaki | ............ | G11C 13/004 |
| | | | | 365/148 |
| 2007/0115717 A1* | 5/2007 | Yang | ............... | G11C 11/16 |
| | | | | 365/171 |
| 2007/0159870 A1* | 7/2007 | Tanizaki | ............ | G11C 11/16 |
| | | | | 365/158 |
| 2009/0086531 A1* | 4/2009 | Yang | ............... | G11C 29/06 |
| | | | | 365/158 |
| 2018/0366186 A1* | 12/2018 | Han | ............... | G11C 13/0028 |
| 2020/0111836 A1* | 4/2020 | Tomita | ............ | G11C 13/0028 |

* cited by examiner

MEMORY DEVICE HAVING REFERENCE MEMORY ARRAY STRUCTURE RESEMBLING DATA MEMORY ARRAY STRUCTURE, AND METHODS OF OPERATING THE SAME

CROSS REFERENCE TO RELATED APPLICATIONS

This non-provisional application claims priority of U.S. provisional application No. 63/127,165, filed on Dec. 18, 2020, and U.S. provisional application No. 63/150,585, filed on Feb. 18, 2021, included herein by reference in its entirety.

BACKGROUND OF THE INVENTION

1. Field of the Invention

The invention relates to the field of non-volatile random access memory, and in particular, to a memory device having a reference memory array structure resembling a data memory array structure, and methods of operating the same.

2. Description of the Prior Art

Resistive memory devices such as magnetoresistive random-access memory (MRAM) is a type of non-volatile random access memory that store data by changing an electrical resistance of a memory cell. The resistive memory devices have drawn wide attention by virtue of high operation speed, high capacity, low power consumption, low manufacturing cost and high reliability.

Nevertheless, in the related art, the resistive memory devices employ a data array and a reference array that are inconsistent in structure. Specifically, switches are adopted between columns of cells in the reference array for read and write control, while not in the data array, being difficult for the reference array to simulate characteristics of the data array owing to the structure dissimilarity between the reference array and the data array.

SUMMARY OF THE INVENTION

According to an embodiment of the invention, a memory device includes a first reference memory array, a data memory array and a detection circuit. The first reference memory array includes a first reference cell and a second reference cell. The first reference cell includes a first terminal coupled to a first reference bit line, a second terminal coupled to a first reference source line, and a control terminal coupled to a first reference word line. The second reference cell includes a first terminal coupled a second reference bit line, a second terminal coupled to the first reference source line, and a control terminal coupled to the first reference word line. The data memory array includes a first data cell and a second data cell. The first data cell includes a first terminal coupled to a first bit line, a second terminal coupled to a first source line, and a control terminal coupled to a first word line. The second data cell includes a first terminal coupled to a second bit line, a second terminal coupled to a second source line, and a control terminal coupled to the first word line. The detection circuit is used to compare a reference current from the reference memory array and a data current from the data memory array.

According to another embodiment of the invention, a memory device includes a data memory array, a reference memory array and a detection circuit. The data memory array includes memory cells configured to output a data current. The reference memory array configured to output a reference current includes (N/2+1) bit lines, reference cells arranged into rows and columns. Each reference cell includes a first terminal and a second terminal. Each row of reference cells includes a (2n−1)th reference cell and a (2n)th reference cell. The (2n−1)th reference cell includes a first terminal coupled to an nth bit line, and a second terminal coupled to an nth source line, n being a positive integer less than N/2+1. The (2n)th reference cell includes a first terminal coupled to an (n+1)th bit line, and a second terminal coupled to the nth source line. The detection circuit is coupled to the data memory array and the reference memory array, and is used to compare the data current and the reference current to determine a data state of a memory cell in the data memory array.

According to another embodiment of the invention, a memory device includes a data memory array, a reference memory array and a detection circuit, N being a positive even integer. The reference memory array includes (N/2+1) bit lines, (N/2) source lines, and reference cells. The reference cells are arranged into a first set of rows, a second set of rows and a third set of rows, each row of reference cells comprising a (2n−1)th reference cell and a (2n)th reference cell. The (2n−1)th reference cell includes a first terminal coupled to an nth bit line, and a second terminal coupled to an nth source line. The (2n)th reference cell includes a first terminal coupled to an (n+1)th bit line, and a second terminal coupled to the nth source line, n being a positive integer less than N/2+1. The detection circuit is coupled to the data memory array and the reference memory array. A method of operating the memory device includes setting memory cells in the data memory array to a first state to output respective data currents, setting reference cells in the second reference array and reference cells in the third reference array to a second state, and setting reference cells in the first reference array and a portion of reference cells in the second reference array to the first state. The method further includes selecting a first candidate selection of N rows from the first reference array, the second reference array and the third reference array to output a first reference current, the detection circuit comparing the respective data currents from the data memory array to the first reference current to determine respective data states of the memory cells, and determining whether to use the first candidate selection for determining the first state of the memory cells according to the respective data states of the memory cells.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
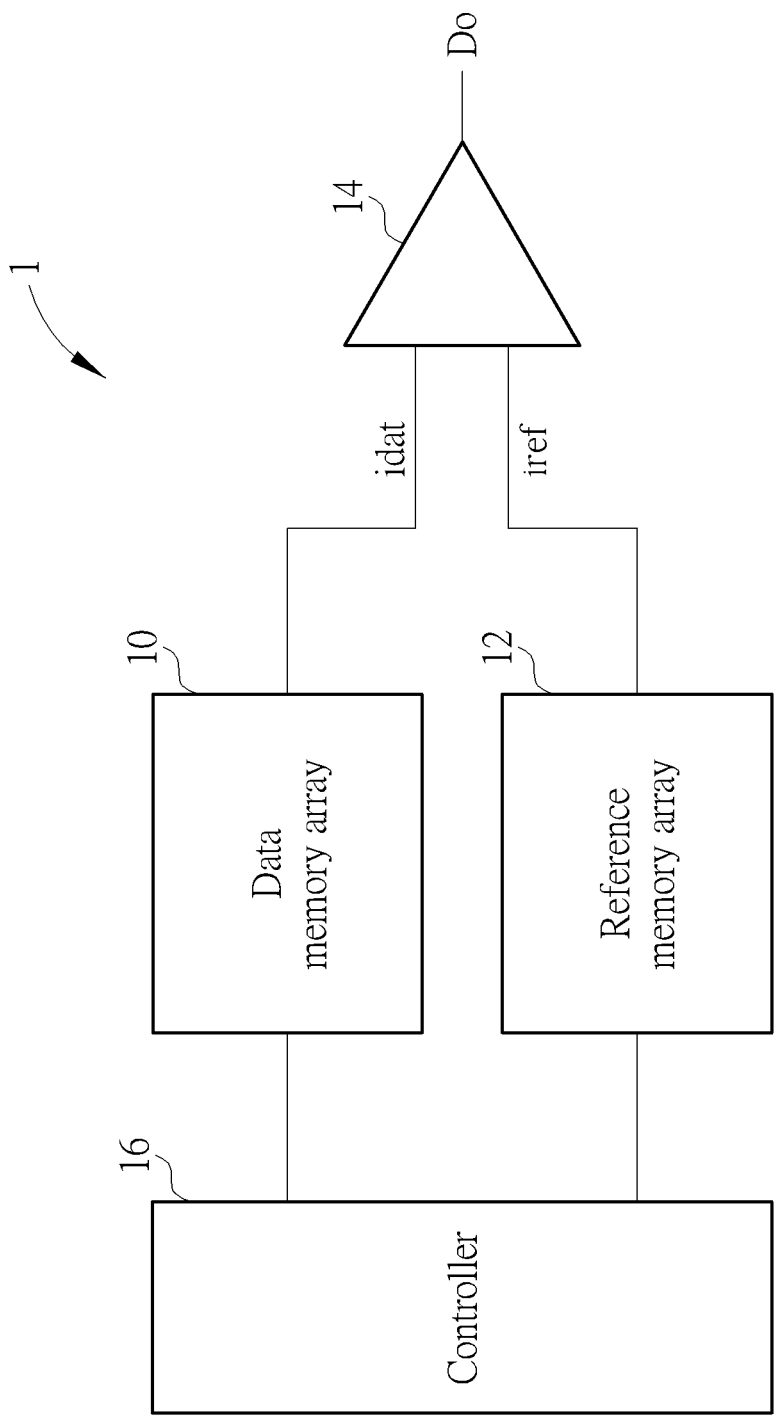
FIG. 1 is a block diagram of a memory device according to an embodiment of the invention.

FIG. 1 is a block diagram of a memory device 1 according to an embodiment of the invention. The memory device 1 may be a magnetoresistive random-access memory (MRAM) or other resistive memory devices. The memory device 1 includes a data memory array 10, a reference memory array 12, a detection circuit 14, and a controller 16. The controller 16 may be coupled to the data memory array 10 and the reference memory array 12. The detection circuit 14 may be coupled to the data memory array 10 and the reference memory array 12.

The data memory array 10 includes a plurality of memory cells to store data. The reference memory array 12 includes a plurality of reference cells to generate a reference current iref. The circuit placement and electrical connection of the reference cells in the reference memory array 12 may be configured in a similar manner to the memory cells in the data memory array 10 to closely track variations of the circuit characteristics of the data memory array 10 as process, temperature, data retention and cycling endurance of the memory cells change. The circuit characteristics may include but are not limited to the resistance of the memory cells of the data memory array 10.

The controller 16 may control the data memory array 10 and the reference memory array 12 for reading and writing the same. In a read operation, the controller 16 may select a memory cell from the data memory array 10 to output a data current idat, and configure the reference memory array 12 to output a reference current iref. The detection circuit 14 may be a sense amplifier configured to compare the data current idat from the data memory array 10 and the reference current iref from the reference memory array 12, so as to determine a data state Do of the memory cell in the data memory array 10. Accordingly, the selection of the reference current iref is crucial for an accurate determination of the data state Do of the selected memory cell.

The reference memory array 12 may generate a plurality of levels of the reference current iref in a linear manner. For example, the reference memory array 12 may generate 32 levels for the reference current iref, the 32 levels may range between 0.5 mA to 0.2 mA, each succeeding level is different from a preceding level by approximately 0.01 mA. The linearity of the reference current iref enables a simple operation of determining an appropriate level of the reference current iref for the read operation. Further, the reference memory array 12 may employ no switch device between adjacent columns of reference cells to better simulate the circuit placement and electrical connection of the memory cells in the data memory array 12.

Figure 2:
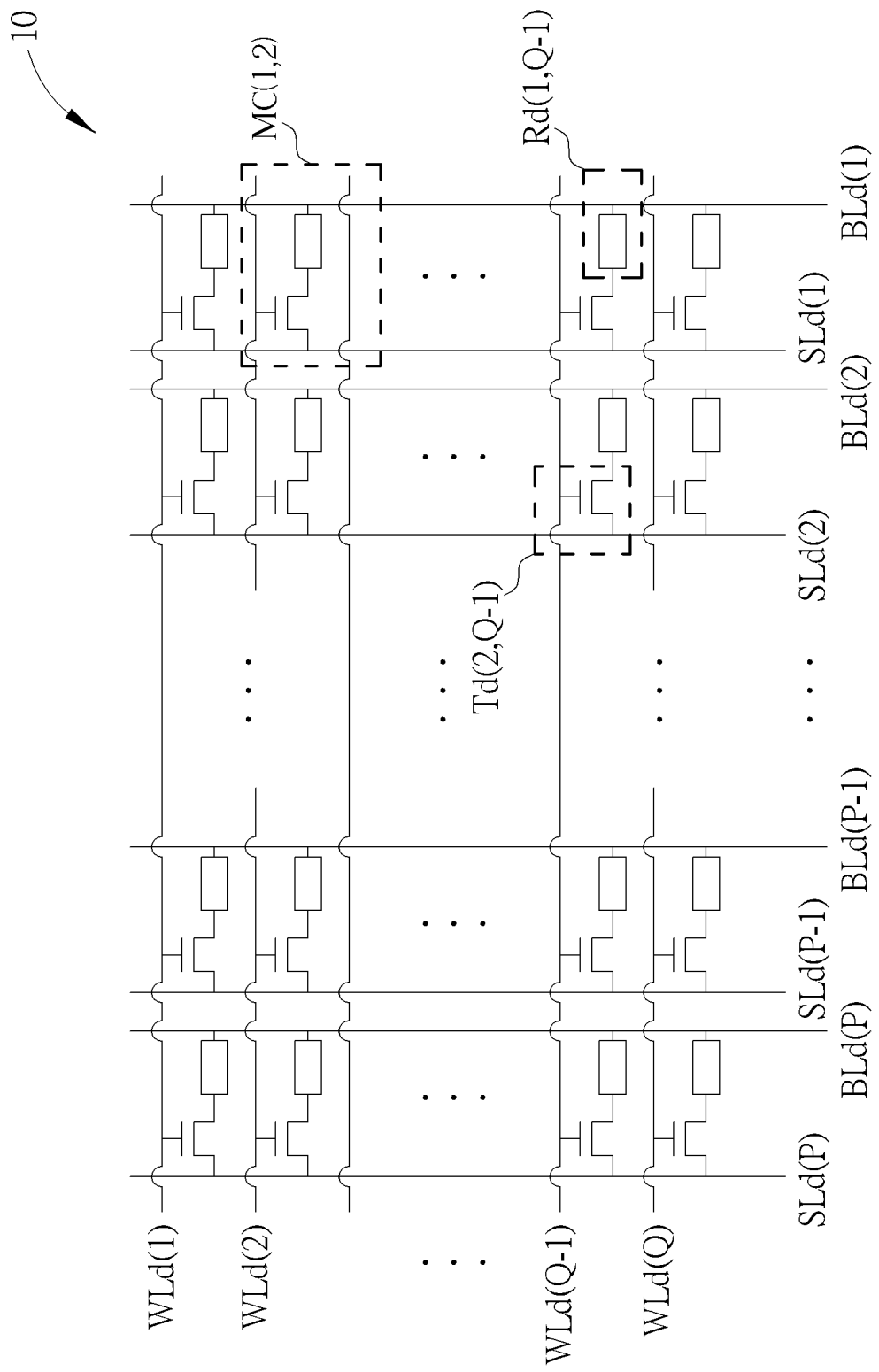
FIG. 2 is a circuit schematic of an exemplary data memory array in FIG. 1.

FIG. 2 is a circuit schematic of an exemplary data memory array 10. The data memory array 10 may include memory cells MC(1,1) to MC(P,Q), word lines WLd(1) to WLd(Q), bit lines BLd(1) to BLd(P), and source lines SLd(1) to SLd(P), where P, Q are positive integers exceeding 1. The memory cells MC(1,1) to MC(P,Q) may be arranged into Q rows and P columns. Each memory cell MC(p,q) may include a transistor Td(p,q) and a variable resistance component Rd(p,q), where p is a positive integer ranging between 1 and P, q is a positive integer ranging between 1 and Q. For example, FIG. 2 shows a memory cell MC(1,2) located at the intersection of the first column and the second row, the transistor Td(2,Q−1) is located at the intersection of the second column and the (Q−1)th row, and the variable resistance component Rd(1,Q−1) is located at the intersection of the first column and the (Q−1)th row. The qth row of memory cells MC(1,q) to MC(P,q) may be coupled to a word line WLd(q), and the pth column of memory cells MC(p,1) to MC(p,Q) may be coupled to a bit line BLd(p) and a source line SLd(p).

Each transistor Td(p,q) may be an NMOS transistor. Each variable resistance component Rd(p,q) may be a magnetic tunnel junction which can be selectively set to a parallel state (P state) or an anti-parallel state (AP state) to store one bit of data. The P state corresponds to a state of low resistance, and the AP state corresponds to a state of high resistance. The value of the high resistance and the value of the low resistance may be determined by the characteristic of the materials of the magnetic tunnel junction. For example, the high resistance may be 5.5 k ohms, and the low resistance may be 2 k ohms. The controller 16 may select one or more memory cells MC(1,1) to MC(P,Q) from the data memory array 10 via the word lines WLd(1) to WLd(Q), the bit lines BLd(1) to BLd(P), and the source lines SLd(1) to SLd(P) for writing or reading data states thereof.

In a read operation, a memory cell MC(p,q) may be configured to output a data current idat. In some embodiments, in a read operation, the controller 16 may apply a turn-on voltage, e.g., 1V to the word line WLd(q) and apply a read voltage e.g., 1V to the source line SLd(p) to generate the data current idat. The size of the data current idat may be determined by the resistance of the variable resistance component Rd(p,q). If the variable resistance component Rd(p,q) is set to the P state, the variable resistance component Rd(p,q) may exhibit the low resistance, and the data current idat may be larger. If the variable resistance component Rd(p,q) is set to the AP state, the variable resistance component Rd(p,q) may exhibit the high resistance, and the data current idat may be smaller.

In a write operation, the controller 16 may select and write a memory cell MC(p, q) by applying a turn-on voltage to the corresponding word line WLd(q), applying a first voltage and a second voltage to the bit line BLd(q) and the source line SLd(q). Specifically, when writing the P state into the memory cell MC(p, q), the controller 16 may apply the first voltage to the bit line BLd(q) and apply the second voltage to the source line SLd(q), and when writing the AP state into the memory cell MC(p, q), the controller 16 may apply the first voltage to the source line SLd(q) and apply the second voltage to the bit line BLd(q). The voltage difference between the first voltage and the second voltage can be varied based on the device characteristics of the memory cell MC(p, q). For example, the first voltage can be 1.4V and the second voltage can be 0V. In addition, the turn-on voltage for writing the AP state can be equal to or larger than the turn-on voltage for writing the P state. For example, the turn-on voltage for writing the AP state can be 1.6V and the turn-on voltage for writing the P state can be 1V. In some embodiments, the first voltage is larger than the second voltage, but the present disclosure is not limited thereto.

Figure 3:
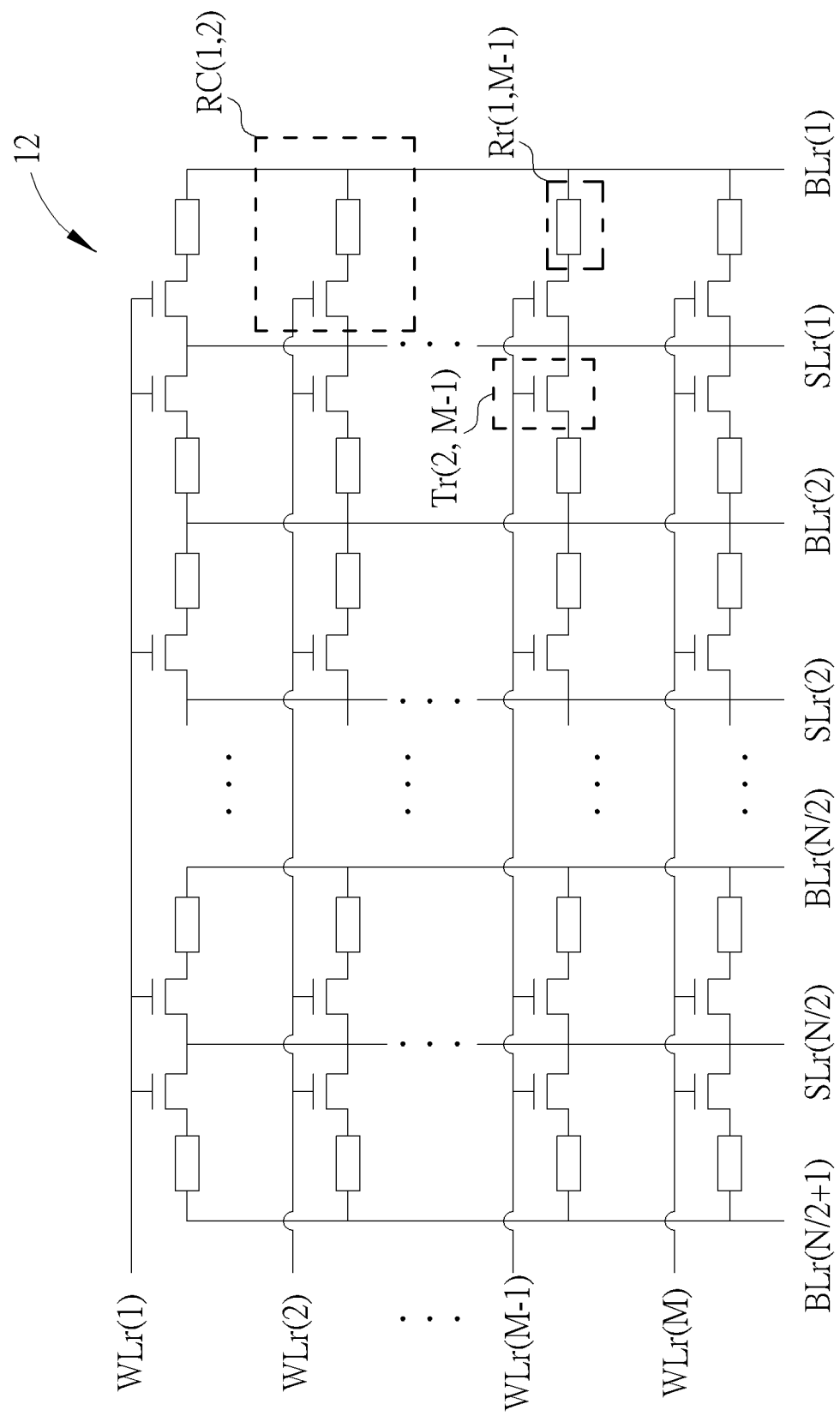
FIG. 3 is a circuit schematic of an exemplary reference memory array in FIG. 1.

FIG. 3 is a circuit schematic of an exemplary reference memory array 12. The reference memory array 12 may include reference cells RC(1,1) to RC(N,M), word lines WLr(1) to WLr(M), bit lines BLr(1) to BLr(N/2+1), and source lines SLr(1) to SLr(N/2), where N is a positive integer, and M is a positive integer exceeding N. In some embodiments, N is an even integer. The reference cells RC(1,1) to RC(N,M) may be arranged into M rows and N columns. In the mth row, the reference cell RC(2n−1,m) may include a first terminal coupled to a bit line BLr(n), a second terminal coupled to a source line SLr(n), and a control terminal coupled to a word line WLr(m), where m and n are positive integers. The reference cell RC(2n,m) may include a first terminal coupled to a bit line BLr(n+1), a second terminal coupled to the source line SLr(n), and a control terminal coupled to the word line WLr(m). The reference cell RC(2n+1,m) may include a first terminal coupled to the bit line BLr(n+1), a second terminal coupled to the source line SLr(n+1), and a control terminal coupled to the word line WLr(m). The reference cells RC(2n−1,m) and RC(2n,m) share a common source line Slr(n), and the reference cells RC(2n,m) and RC(2n+1,m) share a common bit line BLr(n+1). For example, when n=1 and m=1, the reference cell RC(1,1) may include a first terminal coupled to the bit line BLr(1) (=n), a second terminal coupled to the source line SLr(1) (=n), and a control terminal coupled to the word line WLr(1) (=m), the reference cell RC(2,1) may include a first terminal coupled to the bit line BLr(2) (=n+1), a second terminal coupled to the source line SLr(1) (=n), and a control terminal coupled to the word line WLr(1) (=m), and the reference cell RC(3,1) may include a first terminal coupled to the bit line BLr(2) (=n+1), a second terminal coupled to the source line SLr(2) (=n+1), and a control terminal coupled to the word line WLr(1) (=m).

Similarly, in the (m+1)th row, the reference cell RC(2n−1,m+1) may include a first terminal coupled to the bit line BLr(n), a second terminal coupled to the source line SLr(n), and a control terminal coupled to a word line WLr(m+1). The reference cell RC(2n,m+1) may include a first terminal coupled to a bit line BLr(n+1), a second terminal coupled to the source line SLr(n), and a control terminal coupled to the word line WLr(m+1). The reference cell RC(2n+1,m+1) may include a first terminal coupled to the bit line BLr(n+1), a second terminal coupled to the source line SLr(n+1), and a control terminal coupled to the word line WLr(m+1). The reference cells RC(2n−1,m+1) and RC(2n,m+1) share a common source line Slr(n), and the reference cells RC(2n,m+1) and RC(2n+1,m+1) share a common bit line BLr(n+1).

Each reference cell of the reference memory array 12 is nearly identical to each memory cell MC(p,q) in bottom layout structure, respectively, except the electrical connections in one or more metal layers. That is, the electrical connections of the reference cell RC(2n−1,m), the reference cell RC(2n,m), the reference cell RC(2n+1,m) and each memory cell MC(p,q) may be different in one or more metal layers. In some embodiments, the first terminal and the second terminal of the memory cell MC(p,q) are separated from the first terminal and the second terminal of the memory cell MC(p+1,q) and the first terminal and the second terminal of the memory cell MC(p−1,q) in layout structure, and may be coupled to each other by one or more metal layer in actual need. On the other hand, the second terminal of the reference cell RC(2n−1,m) and the second terminal of the reference cell RC(2n,m) are coupled to each other in one or more metal layers. The first terminal of the reference cell RC(2n,m) and a first terminal of a (2n+1)th reference cell RC(2n+1,m) are coupled to each other in one or more metal layers. The reference cell RC(2n−1,m) may include a transistor Tr(2n−1,m) and a variable resistance component Rr(2n−1,m). The variable resistance component Rr(2n−1,m) includes a first terminal coupled to the first terminal of the reference cell RC(2n−1,m), and a second terminal. The transistor Tr(2n−1,m) includes a first terminal coupled to the second terminal of the variable resistance component Rr(2n−1,m), a second terminal coupled to the second terminal of the reference cell RC(2n−1,m), and a control terminal coupled to the word line WLr(m). Likewise, the reference cell RC(2n,m) may include a transistor Tr(2n,m) and a variable resistance component Rr(2n,m). The variable resistance component Rr(2n,m) includes a first terminal coupled to the first terminal of the reference cell RC(2n,m), and a second terminal. The transistor Tr(2n,m) includes a first terminal coupled to the second terminal of the variable resistance component Rr(2n,m), a second terminal coupled to the second terminal of the reference cell RC(2n,m), and a control terminal coupled to the word line WLr(m).

In some other embodiments, the data memory array 10 includes memory cells arranged in pairs, that is, the second terminal of the memory cell MC(p−1,q) is coupled to the second terminal of the memory cell MC(p,q), and the second terminal of the memory cell MC(p+1,q) is coupled to the second terminal of a memory cell MC(p+2,q), by sharing the same region in layout structure. The first terminal of the memory cell MC(p,q) is disconnected from the first terminal of the memory cell MC(p−1,q), the memory cell MC(p+1,q), and the memory cell MC(p+2,q). In this embodiment, the second terminal of the reference cell RC(2n−1,m) is coupled to the second terminal of the reference cell RC(2n,m), and the second terminal of the reference cell RC(2n+1,m) is coupled to the second terminal of the reference cell RC(2n+2,m), by sharing the same region in layout structure. The first terminal of the reference cell RC(2n,m) and the first terminal of the reference cell RC(2n,m) are coupled to each other in one or more metal layers. To be noticed, the electrical connections and layout structure of the data memory array 10 are not limited thereto.

FIG. 3 shows a reference cell RC(1,2) is located at the intersection of the first column and the second row, the transistor Tr(2,M−1) is located at the intersection of the second column and the (M−1)th row, and the variable resistance component Rr(1,M−1) is located at the intersection of the first column and the (M−1)th row. The circuit placement and electrical connections of the transistors Tr(2n−1,m), Tr(2n,m) are identical to the transistor Td(p,q) in lower layers below one or more metal layers, and the circuit placement and electrical connections of the variable resistance components Rr(2n−1,m), Rr(2n,m) are identical to the variable resistance component Rd(p,q) in lower layers below one or more metal layers.

In a write operation, each variable resistance component of the reference cells RC(1,1) to RC(N,M) may be selectively set to the P state or the AP state. Since the reference cells RC(2n−1,1) to RC(2n−1,M) and the reference cells RC(2n,1) to RC(2n,M) share the source line SLr(n), and the reference cells RC(2n, 1) to RC(2n,M) and the reference cells RC(2n+1,1) to RC(2n+1,M) share the bit line BLr(n+1), the writing control of the reference memory array 12 may be different from that of the data memory array 10. The writing control of the reference memory array 12 will be explained in detail in FIG. 4.

In a read operation, the reference memory array 12 may generate at least one level of the reference current iref for determining the P state and the AP state, and the detection circuit 14 may receive the reference current iref corresponding to the reference cells RC(1,1) to RC(N,M) in the reference memory array 12 to determine a data state Do of a data cell in the data memory array 10. In some embodiments, the reference memory array 12 may generate a predetermined level of the reference current iref for determining the P state and the AP state. The controller 16 may select a set of N rows from the M rows of the reference cells RC(1,1) to RC(N,M) by applying the turn-on voltage to N selected word lines to form a resistor grid of N×N variable resistance components. In the resistor grid, the variable resistance components in each column are coupled in parallel to each other, and the variable resistance components in each row are coupled in series to each other. For example, the variable resistance components Rr(n, 1) to Rr(n,M) in the nth row are coupled in parallel to each other, and the variable resistance components Rr(1,m) to Rr(N,m) in the mth row are serially coupled to each other. The equivalent resistance of the parallel-connected and serial-connected resistor grid may be equal to the average resistance of the variable resistance components in the set of N rows. The variable resistance components in the set of N rows may be preset to produce an average resistance between an correctable lower limit of the resistance of the P state and a correctable upper limit of the resistance of the AP state. The controller 16 may apply the read voltage to the bit line BLr(N/2+1) for the set of N rows to generate the reference current iref.

In other embodiments, the reference memory array 12 may generate two separate levels of the reference current iref for determining the P state and the AP state. The controller 16 may select a first set of N rows from the M rows of the reference cells RC(1,1) to RC(N,M), and apply the read voltage to the bit line BLr(N/2+1) for the first set to generate a first level of the reference current iref for determining the P state. The first level of the reference current iref for determining the P state may be higher than or equal to the correctable lower limit of the resistance of the P state. Similarly, the reference memory array 12 may select a second set of N rows from the M rows of the reference cells RC(1,1) to RC(N,M) and apply the read voltage to the bit line BLr(N/2+1) for the second set of to generate a second level of the reference current iref for determining the AP state. The second level of the reference current iref for determining the P state may be less than or equal to the correctable upper limit of the resistance of the AP state.

Figure 4:
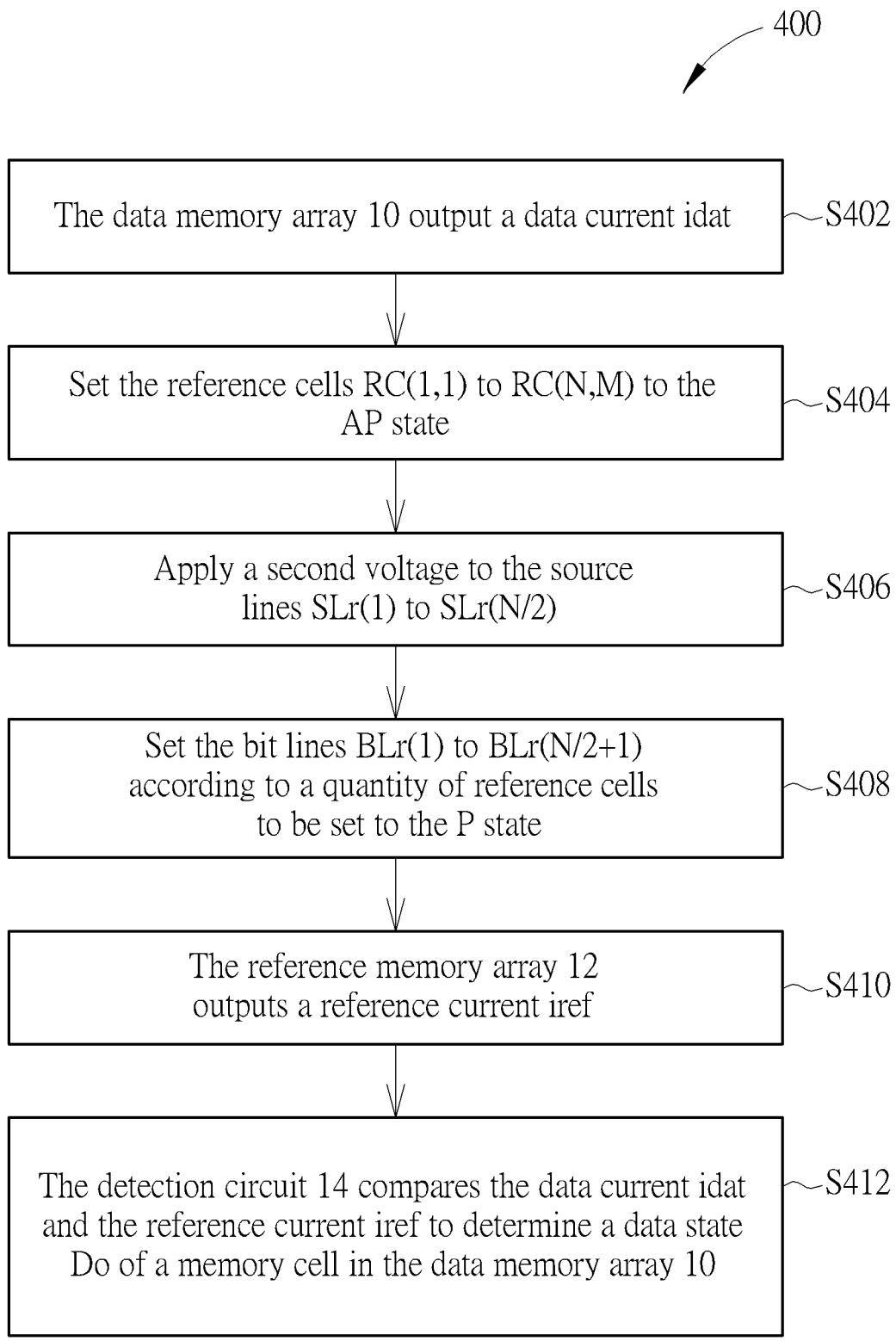
FIG. 4 is a flow chart of a method of operating the memory device in FIG. 1.

FIG. 4 is a flow chart of a method 400 of operating the memory device 1. The method 400 includes Steps S402 to S412. Any reasonable technological change or step adjustment is within the scope of the disclosure. Steps S402 to S412 are provided as follows:

Step S402: The data memory array 10 outputs a data current idat;
Step S404: Set the reference cells RC(1,1) to RC(N,M) to the AP state;
Step S406: Apply a second voltage to the source lines SLr(1) to SLr(N/2);
Step S408: Set the bit lines BLr(1) to BLr(N/2+1) according to a quantity of reference cells to be set to the P state;
Step S410: The reference memory array 12 outputs a reference current iref;
Step S412: The detection circuit 14 compares the data current idat and the reference current iref to determine a data state Do of a memory cell in the data memory array 10.

In Step S402, the controller 16 selects a memory cell MC(p,q) from the data memory array 10 to output the data current idat. In Step S404, the controller 16 applies the turn-on voltage to the word lines WLr(1) to WLr(M), applies the first voltage to the source lines SLr(1) to SLr(N/2) and applies the second voltage to the bit lines BLr(1) to BLr(N/2+1) to set all the reference cells RC(1,1) to RC(N,M) in the reference memory array 12 to the AP state.

In Steps S406 and S408, the controller 16 sets a quantity of reference cells of a selected row to the P state without changing the AP state of the remaining reference cells. The quantity of reference cells may be a non-negative integer less than N+1. The controller 16 applies the first voltage to the bit line BLr(1) for an odd number of the quantity of reference cells, and applies the second voltage to the bit line BLr(1) for a non-zero even number of the quantity of reference cells. The bit line BLr(1) is coupled to an odd number (e.g., 1) of the reference cell(s) in the selected row. When setting (2*S−1) reference cells of the selected row to the P state, the controller 16 applies the first voltage to S bit lines and applies the second voltage to remaining bit lines, S being a positive integer less than N/2+1. When S is equal to 1, the controller 16 applies the first voltage to the bit line BLr(1) and applies the second voltage to the remaining bit lines BLr(2) to BLr(N/2+1). When S is between 2 to N/2, the controller 16 applies the first voltage to the bit line BLr(1) to the bit line BLr(S) and applies the second voltage to the bit line BLr(S+1) to an bit line BLr(N/2+1).

In Steps S410 and S412, for example, the reference memory array 12 outputs a reference current iref to the detection circuit 14 by coupling the detection circuit 14 to the bit line BLr(1) and coupling the bit line BLr(N/2+1) to ground, or by coupling the detection circuit 14 to the bit line BLr(N/2+1) and coupling the bit line BLr(1) to ground.

Table 1 shows bit line settings for setting various quantities of reference cells from the AP state to the P state. When 3 reference cells are to be set to the P state, the first voltage V1 is applied to the bit lines BL(1) and BL(2), and the second voltage V2 is applied to the remaining bit lines BL(3) to BL(5).

TABLE 1

| Quantity of P state reference cells | BL(1) | BL(2) | BL(3) | BL(4) | BL(5) |
| --- | --- | --- | --- | --- | --- |
| 0 | V2 | V2 | V2 | V2 | V2 |
| 1 | V1 | V2 | V2 | V2 | V2 |
| 2 | V2 | V1 | V2 | V2 | V2 |
| 3 | V1 | V1 | V2 | V2 | V2 |
| 4 | V2 | V1 | V1 | V2 | V2 |
| 5 | V1 | V1 | V1 | V2 | V2 |
| 6 | V2 | V1 | V1 | V1 | V2 |
| 7 | V1 | V1 | V1 | V1 | V2 |
| 8 | V2 | V1 | V1 | V1 | V1 |

When setting 2S reference cells of the selected row to the P state, the controller 16 applies the first voltage to S bit lines and applies the second voltage to remaining bit lines, S being a positive integer less than N/2+1. When S is equal to 1, the controller 16 applies the first voltage to the bit line BLr(2) and applies the second voltage to the remaining bit lines BLr(1), BLr(3) to BLr(N/2+1). When S is between 2 to N/2−1, the controller 16 applies the first voltage to the bit line BLr(2) to the bit line BLr(+1) and applies the second voltage to the bit line BLr(+2) to the bit line BLr(N/2+1). Table 1 shows that when 4 reference cells are to be set to the P state, the first voltage V1 is applied to the bit lines BL(2) and BL(3), and the second voltage V2 is applied to the remaining bit lines BL(1), BL(4) and BL(5).

In Step S410, the controller 16 selects N rows from the M rows of the reference memory array 12 for the reference memory array 12 to generate the reference current iref. The method of selecting the N rows are selected is detailed in FIGS. 9A and 9B. In Step S412, the data state Do of the selected memory cell MC(p,q) is determined.

While the specific configuration of (N/2+1) bit lines and (N/2) source lines are provided for the reference memory array 12 in FIG. 3, those skilled in the art may recognize that an alternative configuration of (N/2) bit lines and (N/2+1) source lines may be implemented for the reference memory array 12. If the alternative configuration of (N/2) bit lines and (N/2+1) source lines are adopted, the reference cells RC(1,1) to RC(N,M) will be set to the P state in Step S404, the second voltage will be applied to the (N/2) bit lines BLr(1) to BLr(N/2) in Step S406, and the (N/2+1) source lines SLr(1) to SLr(N/2+1) will be set according to a quantity of reference cells to be set to the AP state in Step S408. When writing an odd quantity of reference cells of each row in reference memory array 12 into the AP state, the first voltage V1 is applied to the source line SL(1). When setting an even quantity of reference cells of each row in reference memory array 12 into the AP state, the second voltage V2 is applied to the source line SL(1). Table 2 shows source line settings for setting various quantities of reference cells from the P state to the AP state.

TABLE 2

| Quantity of AP state reference cells | SL(1) | SL(2) | SL(3) | SL(4) | SL(5) |
|---|---|---|---|---|---|
| 0 | V2 | V2 | V2 | V2 | V2 |
| 1 | V1 | V2 | V2 | V2 | V2 |
| 2 | V2 | V1 | V2 | V2 | V2 |
| 3 | V1 | V1 | V2 | V2 | V2 |
| 4 | V2 | V2 | V1 | V2 | V2 |
| 5 | V1 | V1 | V1 | V2 | V2 |
| 6 | V2 | V1 | V1 | V1 | V2 |
| 7 | V1 | V1 | V1 | V1 | V2 |
| 8 | V2 | V1 | V1 | V1 | V1 |

Figure 5:
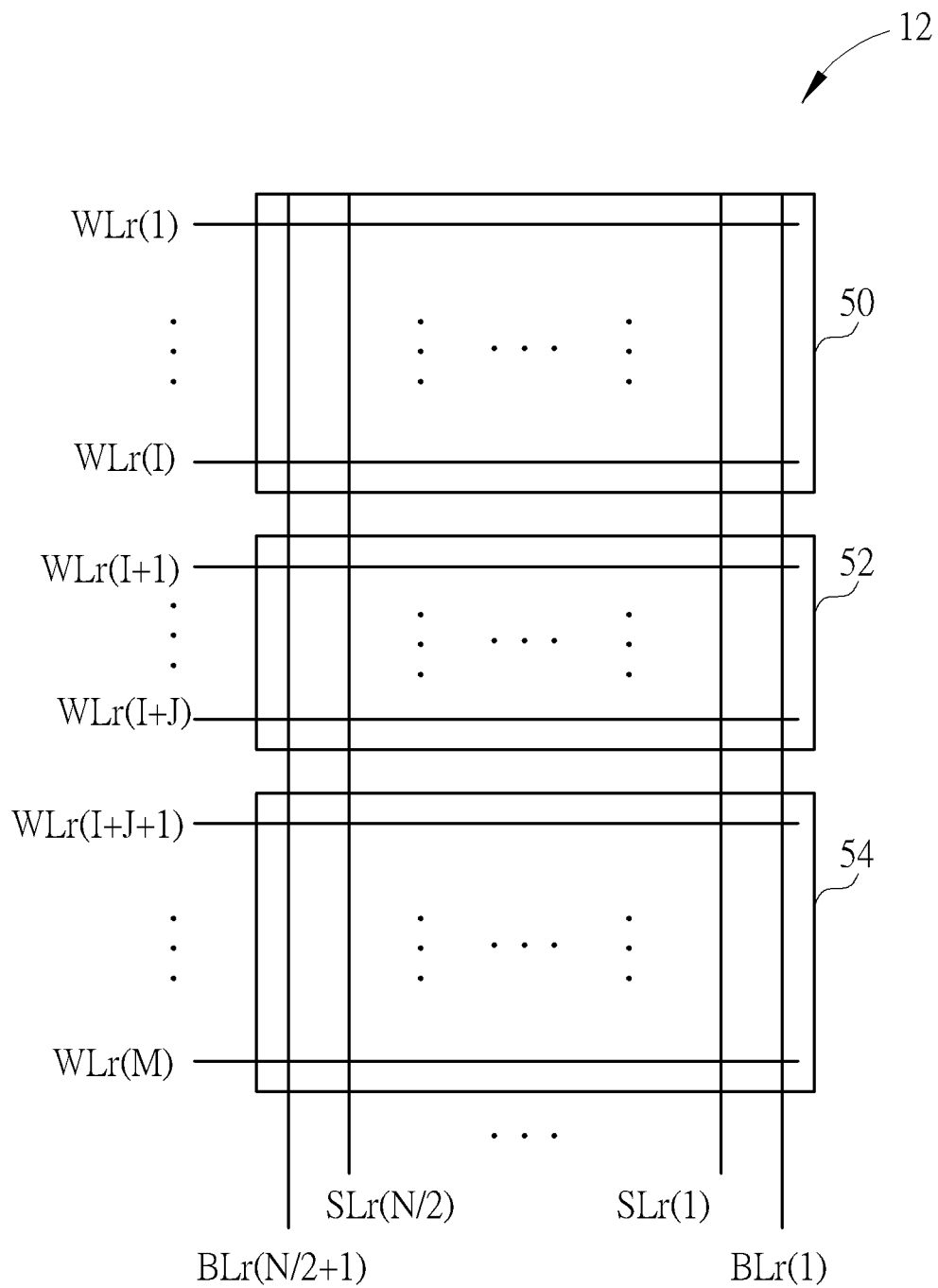
FIG. 5 is a circuit schematic of another exemplary reference memory array in FIG. 1.

FIG. 5 is a circuit schematic of another exemplary reference memory array 12. The reference memory array 12 in FIG. 5 is different from the reference memory array 12 in FIG. 3 in that the reference cells RC(1,1) to RC(N,M) are arranged into a first reference array 50, a second reference array 52 and a third reference array 54. The first reference array 50, the second reference array 52 and the third reference array 54 are coupled together via the bit lines BLr(1) to BLr(N/2+1) and the source lines SLr(1) to SLr(N/2). The reference cells in the first reference array 50 may be arranged into I rows and N columns, and the I rows may be coupled to respective word lines WLr(1) to WLr(I), I being a positive integer. The reference cells in the second reference array 52 may be arranged into J rows and N columns, and the J rows may be coupled to respective word lines WLr(I+1) to WLr(I+J), J being a positive integer equal to or less than N. The reference cells in the third reference array 54 may be arranged into K rows and N columns, and the K rows may be coupled to respective word lines WLr(I+J+1) to WLr(M), K being a positive integer less than N+1. In some embodiments, I and K are equal to N, J is equal to N/2, I+J+K=M. For example, I, K and N are equal to 16, J is equal to 8. The configurations of the reference cells in the first reference array 50, the second reference array 52 and the third reference array 54 are similar to those in FIG. 3, explanation therefor will be omitted here for brevity.

The reference cells of the first reference array 50 and a portion of reference cells of the second reference array 52 may be set to the P state. A remaining portion of the reference cells of the second reference array 52 and the reference cells of the third reference array 54 may be set to the AP state.

For example, the reference cells in the first reference array 50 may be configured into the P-state to result in a 16×16 P matrix, half of the reference cells of each row in the second reference array 52 may be configured into the P-state and the other half of the reference cells of each row in the second reference array 52 may be configured into the AP-state to result in a 8×16 half-P and half-AP matrix, and the reference cells in the third reference array 54 may be configured into the AP-state to result in a 16×16 AP matrix. When 16 rows are selected from the first reference array 50, the equivalent resistance of the selected 16 rows is equal to the resistance of an average memory cell in the P state. When 16 rows are selected the third reference array 54, the equivalent resistance of the selected 16 rows is equal to the resistance of an average memory cell in the AP state. When 16 rows are selected from first reference array 50 and the second reference array 52, or selected from the third reference array 54 and the second reference array 52, the equivalent resistance of the selected 16 rows is somewhere between the resistance of an average memory cell in the P state and the resistance of an average memory cell in the AP state.

In some embodiments, each row of reference cells of the second reference array 52 includes a first number (e.g., L) of reference cells set to the P state, and have a second number (e.g., N-L) of reference cells set to the AP state. A ratio of the P state to the AP state for each row of reference cells in the second reference array 52 may be determined by the low resistance of the P state and the high resistance of the AP state. In one example, the ratio of the P state to the AP state may be 5:11. In other embodiments, a following row of the second reference array 52 may have a smaller number of reference cells set to the P state than a previous row of the second reference array 52. For example, the first row of the second reference array 52 has 12 reference cells set to the P state, the second row of the second reference array 52 has 11 reference cells set to the P state, and the third row of the second reference array 52 has 10 reference cells set to the P state. In yet other embodiments, a following row of the second reference array 52 may have a larger number of reference cells set to the P state than a previous row of the second reference array 52. For example, the first row of the second reference array 52 has 10 reference cells set to the P state, the second row of the second reference array 52 has 11 reference cells set to the P state, and the third row of the second reference array 52 has 12 reference cells set to the P state. The use of a descending ratio or an ascending ratio between the P state and the AP state in the second reference array 52 may potentially enhance the linearity of the reference current iref.

The controller 16 may select a plurality of candidate selections of N rows from the first reference array 50, the second reference array 52 and the third reference array 54. For example, N may be 16, and the controller 16 may select 32 candidate selections of 16 rows from the first reference array 50, the second reference array 52 and the third reference array 54. The first candidate selection may be selected solely from the first reference array 50 and may contain exclusively reference cells in the P state. The second candidate selection may contain 15 rows of reference cells from the first reference array 50 and 1 row of reference cells from the second reference array 52. The 8$^{th}$ candidate selection may contain 8 rows of reference cells from the first reference array 50 and 8 rows of reference cells from the second reference array 52. The 9th candidate selection may contain 8 rows of reference cells from the first reference array 50, 1 row of reference cells from the second reference array 52, and 7 rows of reference cells from the third reference array 54. The $16^{th}$ candidate selection may contain 8 rows of reference cells from the first reference array 50 and 8 rows of reference cells from the third reference array 54. The 17th candidate selection may contain 7 rows of reference cells from the first reference array 50, 1 row of reference cells from the second reference array 52, and 8 rows of reference cells from the third reference array 54. The $24^{th}$ candidate selection may contain 8 rows of reference cells from the second reference array 52 and 8 rows of reference cells from the third reference array 54. The $25^{th}$ candidate selection may contain 7 rows of reference cells from the second reference array 52 and 9 rows of reference cells from the third reference array 54. The $32^{nd}$ candidate selection may contain 16 rows of reference cells from the third reference array 54.

Accordingly, since all rows of reference cells of the first reference array 50 contain only P-state cells, all rows of reference cells of the second reference array 52 contain both P-state cells and AP-state cells, and all rows of reference cells of the third reference array 54 contain only AP-state cells, the equivalent resistances of the $24^{th}$ candidate selection to the first candidate selection are in linear descending order. The $32^{nd}$ candidate selection may provide the highest equivalent resistance, the first candidate selection may provide the lowest equivalent resistance, and the $16^{th}$ candidate selection and the $17^{th}$ candidate selection have the midmost equivalent resistances. As a consequence, the reference memory array 12 may generate 32 levels of the reference current iref in a linear manner, as shown in FIG. 6.

Figure 6:
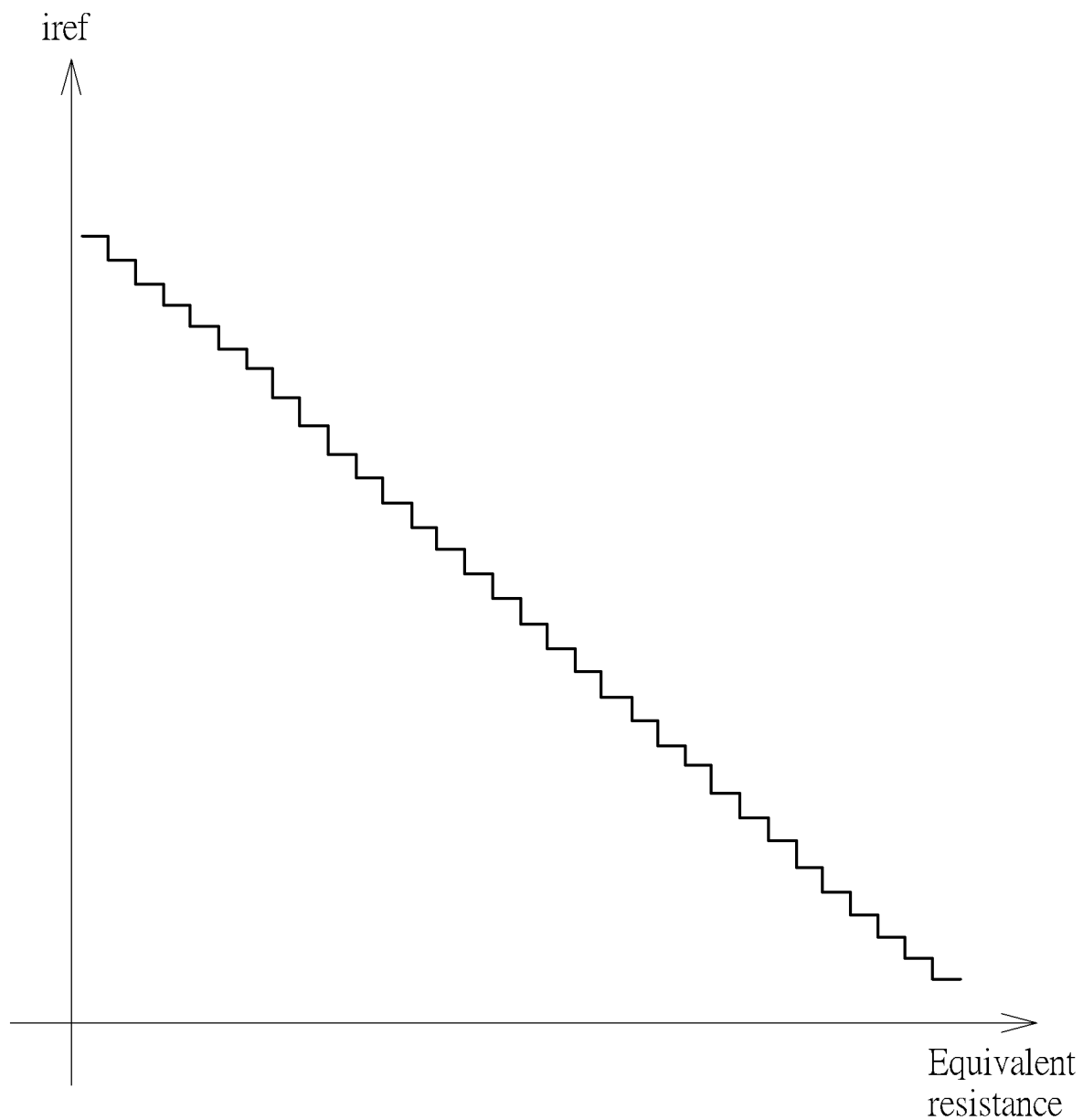
FIG. 6 shows reference currents in various resistance modes generated by the reference memory array in FIG. 1.

FIG. 6 shows the reference currents iref generated by various candidate selections of the reference memory array 12, where the horizontal axis represents the equivalent resistance of the candidate selection of the reference memory array 12, and the vertical axis represents the level of the reference currents iref. FIG. 6 shows the results of 32 candidate selections of the reference memory array 12. Based on the principle described in the preceding paragraphs, for the first candidate selection to the $32^{nd}$ candidate selection, the equivalent resistances thereof will be increased in a linear order, and the corresponding levels of the reference currents iref will be decreased in a linear order. The controller 16 may select an appropriate level of the reference currents iref for determining the P state and/or AP state according to resistance distributions of the data memory array 10 and other requirements. A method of selecting the appropriate level of the reference currents iref will be explained in detail in FIGS. 9A and 9B.

Figure 7:
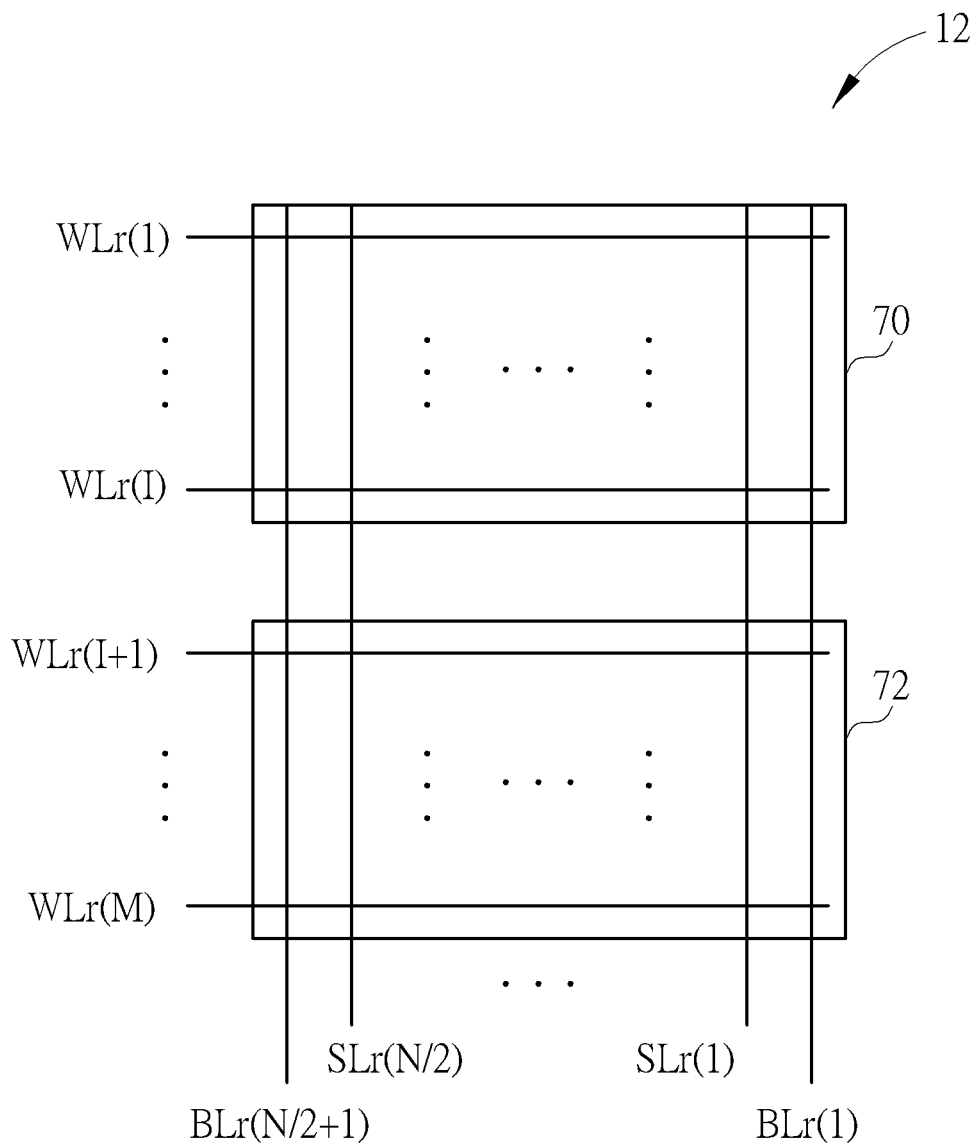
FIG. 7 is a circuit schematic of another exemplary reference memory array in FIG. 1.

FIG. 7 is a circuit schematic of another exemplary reference memory array 12. The reference memory array 12 in FIG. 7 is different from the reference memory array 12 in FIG. 6 in that the reference cells RC(1,1) to RC(N,M) are arranged into a first reference array 70 and a second reference array 72. The reference cells in the first reference array 70 may be arranged into N rows and N columns, and the N rows of the first reference array 70 may be coupled to respective word lines WLr(1) to WLr(N), and the reference cells in the second reference array 72 may be arranged into N rows and N columns, and the N rows of the second reference array 72 may be coupled to respective word lines WLr(N+1) to WLr(M), where M is equal to 2N. For example, N is equal to 16, and the first reference array 70 and the second reference array 72 are both 16×16 arrays.

The reference cells of the first reference array 70 may be set to the P state, and the reference cells of the second reference array 72 may be set to the AP state. The controller 16 may select 16 candidate selections including N rows from the first reference array 70 and the second reference array 72, with the first candidate selection providing the lowest equivalent resistance and the $16^{th}$ candidate selection providing the highest equivalent resistance. The configurations and operations of the first reference array 70 and the second reference array 72 are similar to the first reference array 50 and the third reference array 54, explanation therefor can be found in the preceding paragraphs.

Figure 8:
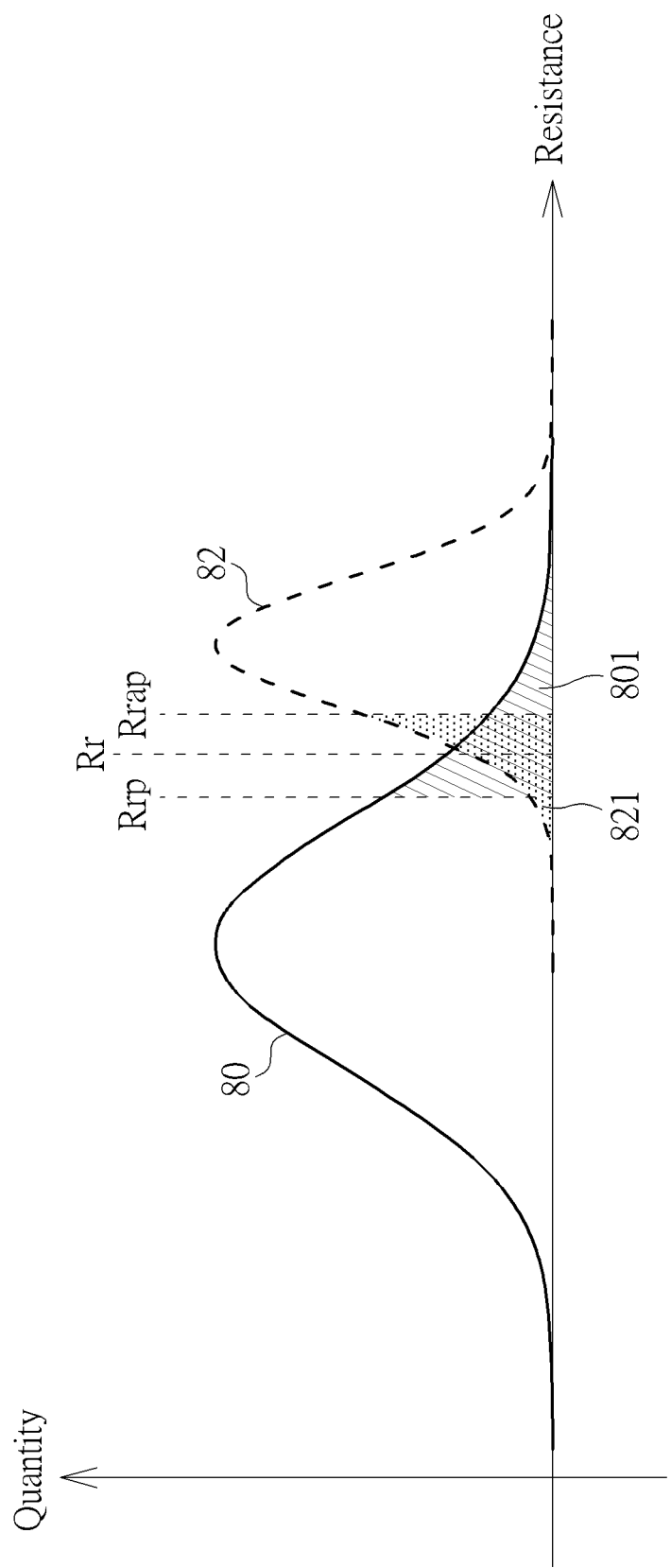
FIG. 8 shows distributions of the reference cells of the reference memory array in FIG. 1.

FIG. 8 shows distributions of the reference cells MC(1,1) to MC(P,Q) of the reference memory array 10, where the horizontal axis represents the resistance, and the vertical axis represents the quantity of the reference cells. Since the electrical characteristics of the reference cells MC(1,1) to MC(P,Q) may be slightly different from each other, when programmed into the P state or the AP state, the reference cells MC(1,1) to MC(P,Q) may show a distribution of resistance variations. A P-state distribution 80 represents the distribution of the reference cells MC(1,1) to MC(P,Q) in the P state, and an AP-state distribution 82 represents the distribution of the reference cells MC(1,1) to MC(P,Q) in the AP state. The shapes of the P-state distribution 80 and the AP-state distribution 82 may be similar or different. Further, the P-state distribution 80 and the AP-state distribution 82 may be fully separated from each other or partially overlapped. In FIG. 8, the P-state distribution 80 shows a wider distribution than the AP-state distribution 82, and the P-state distribution 80 and the AP-state distribution 82 are partially overlapped with each other. The equivalent resistance Rrp is the correctable lower limit of the resistance of the P state and may be selected according to an acceptable error rate for the P state. For example, when up to 20 error bits falsely determined as the AP state can be corrected back to the P state using an error correction code (ECC) or other error correction mechanisms, the equivalent resistance Rrap can be selected to form a slashed area 801 corresponding to 20 bits. Similarly, the equivalent resistance Rrap is the correctable upper limit of the resistance of the P state, and a dotted area 821 corresponds to a quantity of error bits falsely determined as the P state which can be corrected back to the AP state using an error correction code (ECC) or other error correction mechanisms.

Figure 9A:
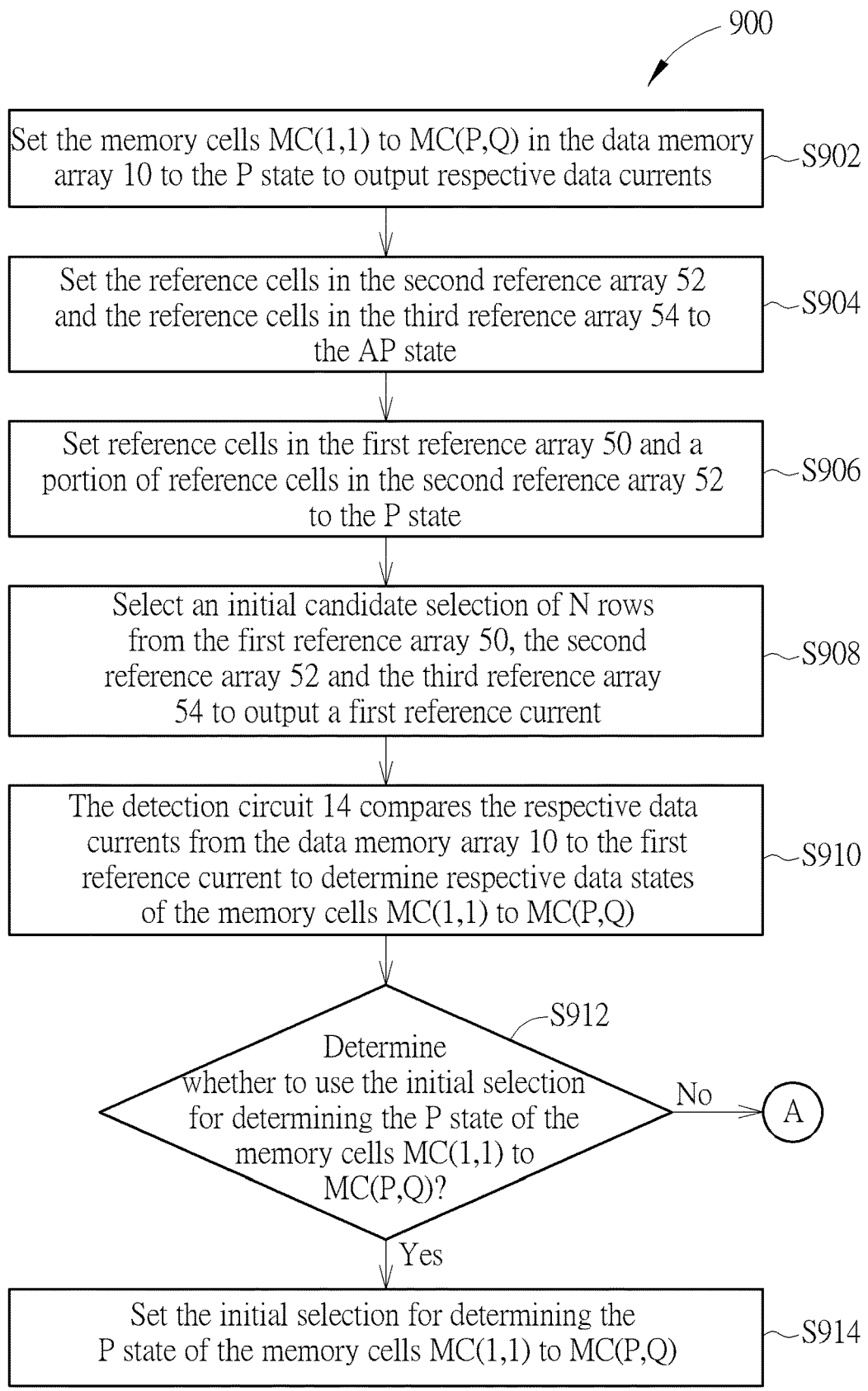
FIGS. 9A and 9B are a flow chart of another method of operating the memory device in FIG. 1.
Figure 9B:
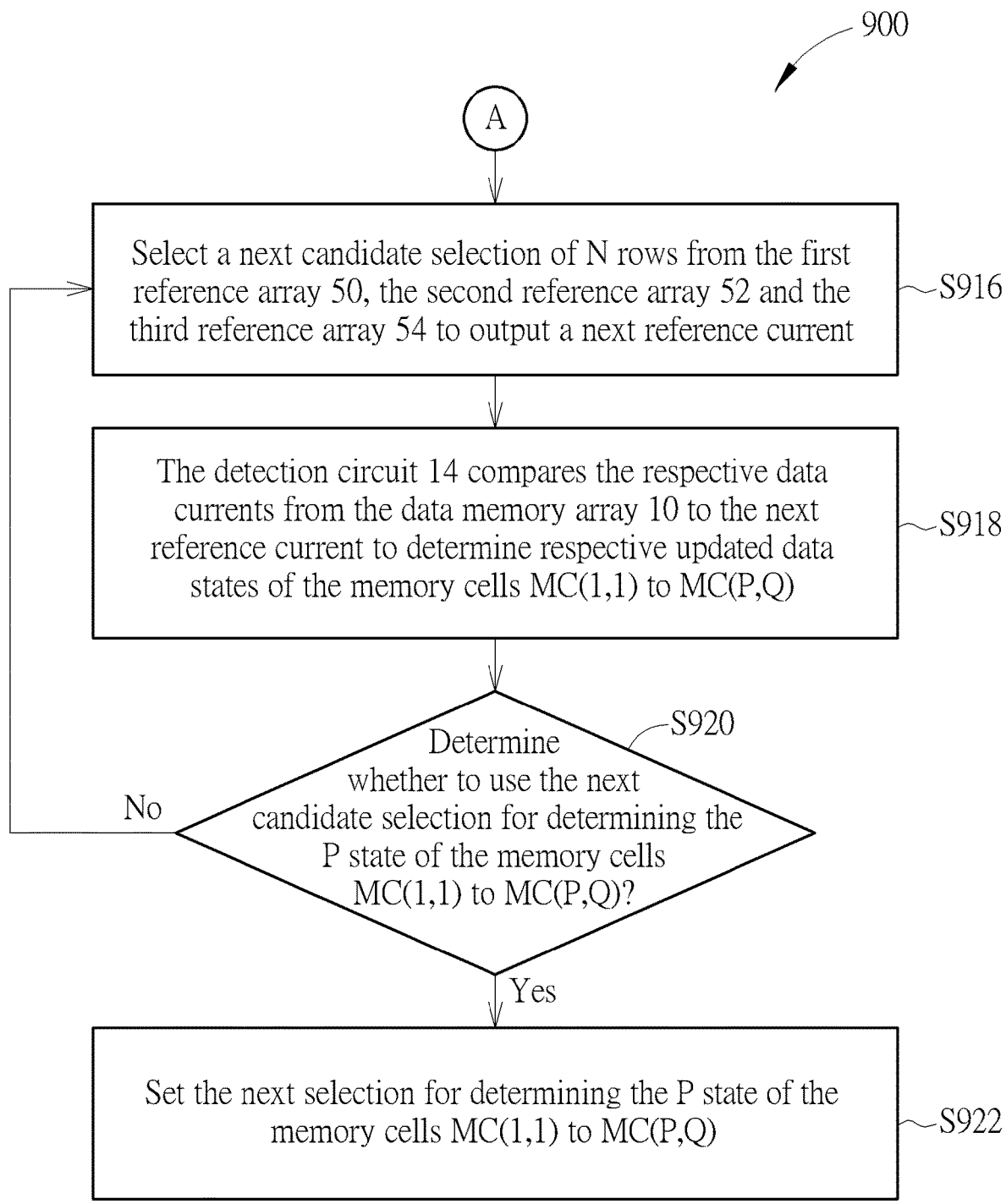

A reference equivalent resistance Rr having value between the equivalent resistance Rrp and the reference equivalent resistance Rrap will be located in an area overlapped by the slashed area 801 and the dotted area 821 in FIG. 8, and may be determined by a method shown in FIGS. 9A and 9B. Please refer to the following paragraphs for detailed operations.

FIGS. 9A and 9B are a flow chart of another method 900 of operating the memory device 1. The method 900 comprises Steps S902 to S922. Steps S902 to S906 are used to initialize the data memory array 10 and the reference memory array 12. Steps S908 to S922 are used to select a first set of N rows from the reference memory array 12 to provide the equivalent resistance Rrp for determining the P state, thereby selecting a second set of N rows from the reference memory array 12 to provide the equivalent resistance Rr for determining the AP state. Any reasonable technological change or step adjustment is within the scope of the disclosure. Steps S902 to S922 are provided as follows:

Step S902: Set the memory cells MC(1,1) to MC(P,Q) in the data memory array 10 to the P state to output respective data currents;

Step S904: Set the reference cells in the second reference array 52 and the reference cells in the third reference array 54 to the AP state;

Step S906: Set reference cells in the first reference array 50 and a portion of reference cells in the second reference array 52 to the P state;

Step S908: Select an initial candidate selection of N rows from the first reference array 50, the second reference array 52 and the third reference array 54 to output a first reference current;

Step S910: The detection circuit 14 compares the respective data currents from the data memory array 10 to the first reference current to determine respective data states of the memory cells MC(1,1) to MC(P,Q);

Step S912: Determine whether to use the initial selection for determining the P state of the memory cells MC(1,1) to MC(P,Q)? If so, go to Step S914; and if not, go to Step S916;

Step S914: Set the initial selection for determining the P state of the memory cells MC(1,1) to MC(P,Q);

Step S916: Select a next candidate selection of N rows from the first reference array 50, the second reference array 52 and the third reference array 54 to output a next reference current;

Step S918: The detection circuit 14 compares the respective data currents from the data memory array 10 to the next reference current to determine respective updated data states of the memory cells MC(1,1) to MC(P,Q);

Step S920: Determine whether to use the next candidate selection for determining the P state of the memory cells MC(1,1) to MC(P,Q)? If so, go to Step S922; and if not, go to Step S916;

Step S922: Set the next selection for determining the P state of the memory cells MC(1,1) to MC(P,Q).

The method 900 will be explained in detail with reference to the memory device 1 in FIG. 1 and the reference memory array 12 in FIG. 5. In Step S902, the data memory array 10 is initialized for selecting the first set of N rows for the P state. Therefore, all the memory cells MC(1,1) to MC(P,Q) are set to the P state. In Steps S904 and 906, the reference cells in the first reference array 50, the second reference array 52 and the third reference array 54 are initialized to be the setting similar to the reference memory array 12 in FIG. 5. That is, the reference cells of the first reference array 50 are set to the P state, the reference cells of the third reference array 54 are set to the AP state, and each row of the reference cells of second reference array 52 is set to a mix of the P state to the AP state by a predetermined ratio, e.g., 5:11.

In Step S908, the initial candidate selection may include a mix of the reference cells set to the P state and the AP state. For example, the 16$^{th}$ candidate selection or the 17$^{th}$ candidate selection may provide a good starting point since both yield the midmost equivalent resistances. In the example, the 16$^{th}$ candidate selection is selected for generating the first reference current. In Step S910, since all the memory cells MC(1,1) to MC(P,Q) have been set to the P state, if the respective data current exceeds the first reference current, the selected reference cell is determined as not in the P state, and the controller 16 identifies a detection error. The controller 16 accumulates the detection errors to generate an erroneous cell count. In Step S912, if the erroneous cell count is less than a predetermined error quantity, the controller 16 determines that the 16$^{th}$ candidate selection may be used for determining the P state. Therefore, the controller 16 sets the 16$^{th}$ candidate selection as the first set for determining the P state (S914). Otherwise, the controller 16 determines that the 16$^{th}$ selection may not be used for determining the P state. The predetermined error quantity may be the number of error bits that can be recovered using an error correction mechanism or a memory redundancy mechanism. For example, predetermined error quantity may be 20.

In Step S916, since the 16$^{th}$ candidate selection fails to deliver a desired error rate, the controller 16 selects the next candidate selection. The next candidate selection may produce an equivalent resistance higher than that of the 16$^{th}$ candidate selection. For example, the 17th candidate selection may be selected for generating the next reference current. In some other embodiments, the candidate selections may be selected from other than the next candidate selection, for example, the 18$^{th}$ candidate selection may be selected after the 16$^{th}$ candidate selection. In Step S918, if the respective data current exceeds the first reference current, the selected reference cell is determined as not in the P state, and the controller 16 identifies a detection error. Again, the controller 16 accumulates the detection errors to generate a new erroneous cell count. In Step S920, if the new erroneous cell count is less than the predetermined error quantity, the controller 16 determines that the 17$^{th}$ candidate selection may be used for determining the P state. Therefore, the controller 16 sets the 17$^{th}$ candidate selection as the first set for determining the P state (S922). Otherwise, the controller 16 determines that the 17th candidate selection may not be used for determining the P state, and the method 900 returns to Step S916 to select the next candidate selection. Steps S916 to S920 will be repeated until the new erroneous cell count is less than the predetermined error quantity, and the controller 16 sets the next selection as the first set for determining the P state (S922).

After the first set of N rows for determining the P state is set, the controller 16 may set another candidate selection of N rows as the second set for determining the AP state. The other candidate selection can generate a reference current iref that is less than that of the first set by a predetermined current difference. For example, the predetermined current difference may be 5 microamperes, the first set may generate 0.35 mA, and the second set may generate 0.345 mA. In this manner, the method 900 may be used to set the first set for determining the P state and set the second set for determining the AP state.

While in the method 900, the first set of for determining the P state is set first, and then the second set for determining the AP state is set according to the equivalent resistance of the first set, those skilled in the art would recognize that it may also set the second set for determining the AP state first, and then set the first set for determining the P state by a similar principle outline in the method 900. Further, while the reference memory array 12 in FIG. 5 is utilized to explain Steps of the method 900, it can be recognize that the reference memory array 12 in FIG. 7 may also be adopted in the method 900 by a similar principle.

The embodiments in FIGS. 1, 3, 5 and 7 provide a structure of the reference memory array 12 resembling that of the data memory array 10, closely tracking variations of the circuit characteristics of the data memory array 10 as process, temperature, data retention and cycling endurance of the memory cells change, while providing linear control of the reference current iref, thereby increasing accuracy of a data state determination. In addition, the embodiments in FIGS. 7, 9A and 9B provide the methods of operating the reference memory array 12 of memory device 1, writing the reference cells and selecting the reference cells to generate an appropriate reference current iref for an accurate data state determination.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device comprising:
   a first reference memory array comprising:
      a first reference cell comprising a first terminal coupled to a first reference bit line, a second terminal coupled to a first reference source line, and a control terminal coupled to a first reference word line;
      a second reference cell comprising a first terminal coupled to a second reference bit line, a second terminal coupled to the first reference source line, and a control terminal coupled to the first reference word line;
      a third reference cell comprising a first terminal coupled to the first reference bit line, a second terminal coupled to the first reference source line, and a control terminal coupled to a second reference word line; and
      a fourth reference cell comprising a first terminal coupled the second reference bit line, a second terminal coupled to the first reference source line, and a control terminal coupled to the second reference word line;
   a data memory array comprising:
      a first data cell comprising a first terminal coupled to a first bit line, a second terminal coupled to a first source line, and a control terminal coupled to a first word line; and
      a second data cell comprising a first terminal coupled to a second bit line, a second terminal coupled to a second source line, and a control terminal coupled to the first word line; and
   a detection circuit coupled to the first bit line to receive a data current corresponding to the first data cell in the data memory array, and coupled to the first reference bit line to receive a reference current corresponding to the first reference cell, the second reference cell, the third reference cell and the fourth reference cell, and configured to compare the reference current from the first reference memory array and the data current from the data memory array to determine a data state of the first data cell coupled to the first bit line in the data memory array.

2. The memory device of claim 1, wherein the first reference memory array further comprising:
   a third reference cell comprising a first terminal coupled to the second reference bit line, a second terminal coupled to a second reference source line, and a control terminal coupled to the first reference word line.

3. The memory device of claim 1, wherein the first reference cell and the first data cell have identical structures.

4. The memory device of claim 1, wherein the first reference cell is coupled to the second reference cell through a metal layer.

5. The memory device of claim 1, further comprising:
   a second reference memory array, coupled to the first reference bit line, wherein the first reference memory array is set to a first state and the second reference memory array is set to a second state.

6. The memory device of claim 5, wherein:
   the first reference memory array is an N by N array; and
   the second reference memory array is an N by N array, N being a positive integer greater than 1.

7. The memory device of claim 5, further comprising:
   a third reference memory array, coupled to the first reference bit line and the second reference bit line, comprising a plurality of rows of reference cells,
   wherein a row of the plurality of rows coupled to a third reference word line comprises a first portion and a second portion, the first portion being coupled to the first reference bit line and the second portion being coupled to the second reference bit line;
   wherein the row is set to a second state by receiving a second voltage from the first reference bit line and the second reference bit line before the first portion is set to the first state by receiving a first voltage from the first reference bit line, wherein the first voltage is larger than the second voltage.

8. The memory device of claim 7, wherein when the first portion has a first odd number of reference cells, the first reference bit line coupled to a second odd number of reference cells in the row is configured to receive the first voltage.

9. The memory device of claim 7, wherein when the first portion has an even number of reference cells, the first reference bit line coupled to an odd number of reference cells in the row is configured to receive the second voltage.

10. The memory device of claim 1, wherein each data cell and each reference cell comprise a magnetoresistive random-access memory cell.

11. The memory device of claim 1, wherein the first source line is coupled to the second source line.

12. A memory device comprising:
   a data memory array comprising memory cells configured to output a data current;
   a reference memory array configured to output a reference current, comprising:
      (N/2+1) bit lines, N being a positive even integer;
      (N/2) source lines;
      reference cells arranged into rows and columns, each reference cell comprising a first terminal and a second terminal, and each row of the reference cells comprising:
         a (2n−1)th reference cell comprising a first terminal coupled to an nth bit line of the (N/2+1) bit lines, and a second terminal coupled to an nth source line of the (N/2) source lines, n being a positive integer less than N/2+1; and
         a (2n)th reference cell comprising a first terminal coupled to an (n+1)th bit line of the (N/2+1) bit lines, and a second terminal coupled to the nth source line of the (N/2) source lines; and
   a detection circuit coupled to the data memory array and the reference memory array, and configured to compare the data current—and the reference current to determine a data state of a memory cell in the data memory array;
   wherein the reference cells are arranged into a first reference array, a second reference array and a third reference array;
   the reference cells of the first reference array and a portion of the reference cells of the second reference array are set to a first state; and
   a remaining portion of the reference cells of the second reference array and the reference cells of the third reference array are set to a second state.

13. The memory device of claim 12, wherein a first number of reference cells set to the first state in a following row of the second reference array is smaller than a second number of reference cells set to the first state in a previous row of the second reference array.

14. The memory device of claim 12, wherein when (2*S−1) reference cells of a row of reference cells in the reference cells are set to the first state, a first reference bit line to an Sth reference bit line of the reference bit lines are configured to receive a first voltage, and a remaining bit line of the reference bit lines is configured to receive a second voltage, wherein S is a positive integer.

15. The memory device of claim 12, wherein when 2S reference cells of a row of reference cells in the reference cells are set to the first state, a second reference bit line to the (S+1)th reference bit line of the reference bit lines are configured to receive a first voltage, and a remaining bit line of the reference bit lines is configured to receive a second voltage, wherein S is a positive integer.

16. A method of operating a memory device, the memory device comprising a data memory array, a reference memory array and a detection circuit, N being a positive even integer, the reference memory array comprising (N/2+1) bit lines, (N/2) source lines, and reference cells arranged into a first reference array, a second reference array and a third reference array, each row of the reference cells comprising a (2n−1)th reference cell comprising a first terminal coupled to an nth bit line, and a second terminal coupled to an nth source line, and a (2n)th reference cell comprising a first terminal coupled to an (n+1)th bit line, and a second terminal coupled to the nth source line, n being a positive integer less than N/2+1, the detection circuit being coupled to the data memory array and the reference memory array, the method comprising:
  setting memory cells in the data memory array to a first state to output respective data currents;
  setting the reference cells in the second reference array and the reference cells in the third reference array to a second state;
  after setting the reference cells in the second reference array and the reference cells in the third reference array to the second state, setting the reference cells in the first reference array and a portion of the reference cells in the second reference array to the first state;
  selecting a first candidate selection of N rows from the first reference array, the second reference array and the third reference array to output a first reference current;
  comparing the respective data currents from the data memory array to the first reference current to determine respective data states of the memory cells; and
  determining whether to use the first candidate selection for determining the first state of the memory cells according to the respective data states of the memory cells.

17. The method of claim 16, wherein determining whether to use the first candidate selection for determining the first state of the memory cells according to the respective data states of the memory cells comprises:
  if a portion of the memory cells is determined as not in the first state and a cell count of the portion of the memory cells is less than a predetermined error quantity, using the first candidate selection for determining the first state of the memory cells.

18. The method of claim 16, further comprising:
  if a portion of the memory cells is determined as not in the first state and a cell count of the portion of the memory cells is not less than a predetermined error quantity, selecting a second candidate selection of N rows from the first reference array, the second reference array and the third reference array to output a second reference current, the second candidate selection including more reference cells in the second state than the first candidate selection;
  the detection circuit comparing the respective data currents from the data memory array to the second reference current to determine respective updated data states of the memory cells; and
  determining whether to use the second candidate selection for determining the first state of the memory cells according to the respective updated data states of the memory cells.

* * * * *